United States Patent
Hwang (10) Patent No.: US 8,717,834 B2
(45) Date of Patent: May 6, 2014

(54) PROGRAMMING CIRCUIT USING ANTIFUSE

(75) Inventor: Mi Hyun Hwang, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 304 days.

(21) Appl. No.: 13/336,909

(22) Filed: Dec. 23, 2011

(65) Prior Publication Data

US 2012/0182814 A1 Jul. 19, 2012

(30) Foreign Application Priority Data

Jan. 14, 2011 (KR) .................. 10-2011-0004182

(51) Int. Cl.
*G11C 7/22* (2006.01)
(52) U.S. Cl.
USPC ............... 365/189.16; 365/201; 365/225.7; 365/189.11
(58) Field of Classification Search
CPC .............................. G11C 7/1078; G11C 7/22
USPC .............. 365/189.16, 201, 189.12, 225.7
See application file for complete search history.

(56) References Cited

U.S. PATENT DOCUMENTS

| 6,240,033 B1 * | 5/2001 | Yang et al. ............ 365/225.7 |
| 6,373,762 B2 * | 4/2002 | Morgan ................. 365/201 |
| 7,444,575 B2 * | 10/2008 | Ong .................... 714/742 |

FOREIGN PATENT DOCUMENTS

| KR | 1020020032689 A | 4/2002 |
| KR | 100746230 B1 | 7/2007 |
| KR | 102009010978 A | 10/2009 |
| KR | 1020090119223 A | 11/2009 |

* cited by examiner

*Primary Examiner* — Son Dinh
(74) *Attorney, Agent, or Firm* — William Park & Associates Patent Ltd.

(57) ABSTRACT

A programming circuit using an antifuse includes a fuse signal generation unit including an antifuse which connects a node with a low voltage in response to a test address when the node is driven to a level of a high voltage, and configured to output a signal of the node as a fuse signal in response to a test mode signal; and a programming signal generation unit configured to buffer the fuse signal in response to a power-up signal and generate a programming signal.

24 Claims, 5 Drawing Sheets

PROGRAMMING CIRCUIT USING ANTIFUSE

CROSS-REFERENCES TO RELATED APPLICATIONS

The present application claims priority under 35 U.S.C. 119(a) to Korean Application No. 10-2011-0004182, filed on Jan. 14, 2011, in the Korean Intellectual Property Office, which is incorporated herein by reference in its entirety set forth in full.

BACKGROUND

The increase in integration degree and storage capacity of semiconductor memory devices raises the fail occurrence possibility of semiconductor cells during a manufacturing process. This serves as a factor that reduces yield. In general, when a semiconductor memory device has several failed memory cells or even one failed memory cell, the semiconductor memory device may not be placed on the market as a product.

In order to improve the yield of high integration semiconductor memory devices, a variety of attempts have been made. A representative example is a repair technology using a fuse.

In a semiconductor memory device, a repair technology used for repairing a failed cell to allow a chip to operate normally is generally divided into two methods. A first method is a fuse cutting method using a laser device. A second method is a method in which a predetermined amount of high current is applied to a substance forming a fuse so that the substance of the fuse is ruptured and as a result the state of the fuse is electrically shorted.

In particular, since the second method may be used even after the assembly of a chip into a package is completed, it is referred to as an antifuse method. Since a failed cell in a package state may be repaired into a normal cell using the antifuse method, the antifuse method is gaining popularity from chip manufacturers when compared to the fuse cutting method using the laser device.

However, in the antifuse method, problems arise when the fuse substance is not completely ruptured through in one rupturing operation, a misoperation is likely to be caused, and a reliability issue may be raised because the fuse is likely to return to a state before rupture.

SUMMARY

An embodiment of the present invention relates to a programming circuit using an antifuse, in which the dielectric layer of an antifuse is completely ruptured in response to a test address including a periodic pulse when a fail occurs in a cell block, such that a programming signal with high reliability can be generated.

In one embodiment, a programming circuit using an antifuse includes: a fuse signal generation unit including an antifuse which connects a node with a low voltage in response to a test address when the node is driven to a level of a high voltage, and configured to output a signal of the node as a fuse signal in response to a test mode signal; and a programming signal generation unit configured to buffer the fuse signal in response to a power-up signal and generate a programming signal.

In another embodiment, a programming circuit using an antifuse includes: a fuse signal generation unit including an antifuse which connects a node with a low voltage in response to a test address when the node is driven to a level of a high voltage, and configured to connect the node with a ground voltage in response to a test mode signal when the node is not driven to the level of the high voltage and output a signal of the node as a fuse signal, where the fuse signal is buffered in response to a power-up signal and is associated with a programming signal.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
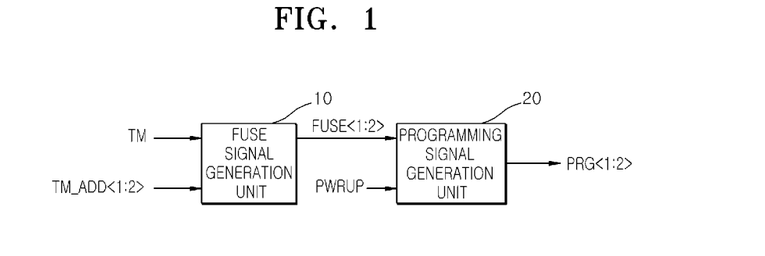
FIG. 1 is a block diagram of a programming circuit using an antifuse in accordance with an embodiment of the present invention.

FIG. 1 is a block diagram of a programming circuit using an antifuse in accordance with an embodiment of the present invention.

Referring to FIG. 1, a programming circuit using an antifuse includes a fuse signal generation unit 10 and a programming signal generation unit 20.

Figure 2:
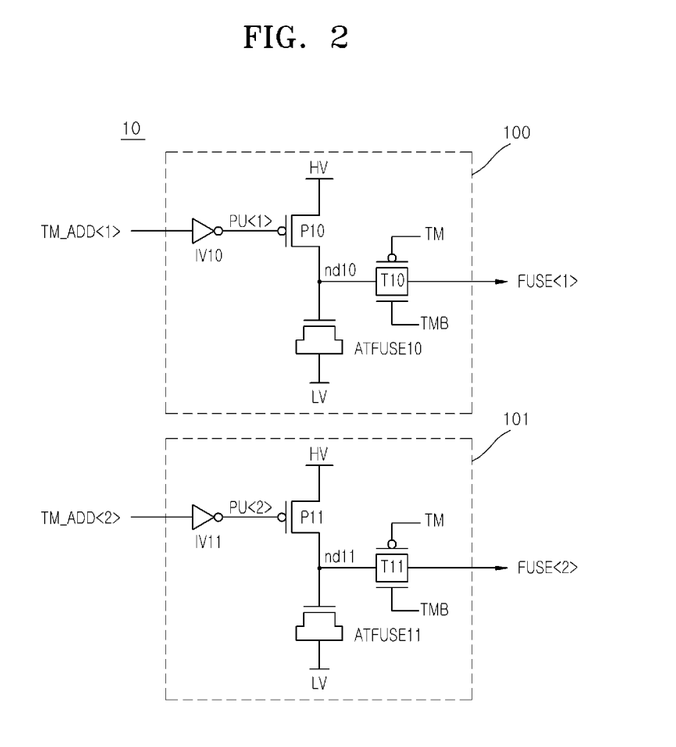
FIG. 2 is a circuit diagram of a fuse signal generation unit shown in FIG. 1.

Referring to FIG. 2, the fuse signal generation unit 10 includes first and second fuse signal generating sections 100 and 101.

The first fuse signal generating section 100 includes a first buffer IV10 configured to invert and buffer a first test address TM_ADD<1> generated as a signal including a periodic pulse. The first buffer IV10 may output a first pull-up signal PU<1> when a fail occurs in a first cell block (not shown) during a period in which a test mode signal TM is enabled. The first fuse generating section 100 may also include a first pull-up element P10 placed between a high voltage HV and a first node nd10 and configured to pull-up drive the first node nd10 to the level of the high voltage HV in response to the first pull-up signal PU<1>. Further, the first fuse generating section 100a may also include a first antifuse ATFUSE10 placed between the first node nd10 and a low voltage LV and configured to be ruptured in the dielectric layer thereof depending upon a level of the first node nd10 and connect the first node nd10 to the low voltage LV. Still further, the first fuse generating section 100 may include a first transfer gate T10 configured to transfer a signal of the first node nd10 as a first fuse signal FUSE<1> in response to the test mode signal TM.

The second fuse signal generating section 101 includes a second buffer IV11 configured to invert and buffer a second test address TM_ADD<2> generated as a signal including a periodic pulse and output a second pull-up signal PU<2> when a fail occurs in a second cell block (not shown) during the period in which the test mode signal TM is enabled. The second fuse signal generating section 101 may also include a second pull-up element P11 placed between the high voltage HV and a second node nd11 and configured to pull-up drive the second node nd11 to the level of the high voltage HV in response to the second pull-up signal PU<2>. Still further, the second fuse signal generating section 101 may include a second antifuse ATFUSE11 placed between the second node nd11 and the low voltage LV and configured to be ruptured in the dielectric layer thereof depending upon the level of the second node nd11 and connect the second node nd11 to the low voltage LV. The second fuse signal generating section 101 may further include a second transfer gate T11 configured to transfer the signal of the second node nd11 as a second fuse signal FUSE<2> in response to the test mode signal TM.

The period in which the test mode signal TM is enabled may be set such that the dielectric layers of the first antifuse ATFUSE10 and the second antifuse ATFUSE11 are completely ruptured. Also, the first test address TM_ADD<1> is generated as a logic low level when a fail does not occur in the first cell block, and the second test address TM_ADD<2> is generated as a logic low level when a fail does not occur in the second cell block.

Figure 3:
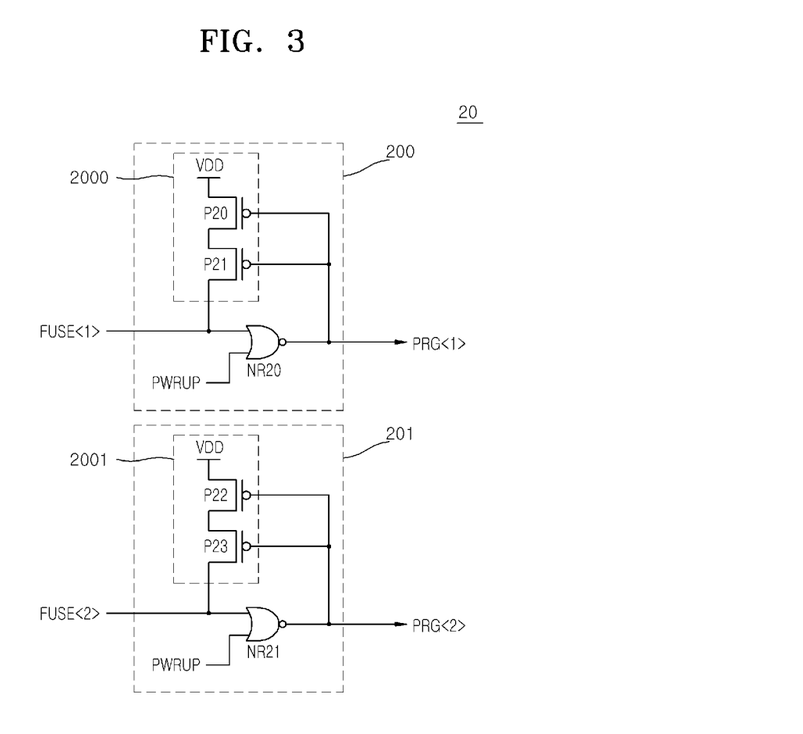
FIG. 3 is a circuit diagram of a programming signal generation unit shown in FIG. 1.

Referring to FIG. 3, the programming signal generation unit 20 includes first and second programming signal generating sections 200 and 201.

The first programming signal generating section 200 includes a NOR gate NR 20 configured to buffer the first fuse signal FUSE<1> and output a first programming signal PRG<1> in response to a power-up signal PWRUP which transitions to a logic low level when the level of a power supply voltage VDD reaches a predetermined target level. The first programming signal generating section 200 further includes a first latch stage 2000 configured to latch the first programming signal PRG<1> when the first fuse signal FUSE<1> is not generated to the level of the low voltage LV.

The second programming signal generating section 201 includes a NOR gate NR 21 configured to buffer the second fuse signal FUSE<2> and output a second programming signal PRG<2> in response to the power-up signal PWRUP which transitions to the logic low level when the level of the power supply voltage VDD reaches the predetermined target level. The second programming signal generating section 201 further includes a second latch stage 2001 configured to latch the second programming signal PRG<2> when the second fuse signal FUSE<2> is not generated to the level of the low voltage LV.

While it was described that the programming circuit using an antifuse in accordance with an embodiment of the present invention generates the first and second programming signals, the programming circuit may also be configured to generate a plurality of programming signals depending upon an embodiment.

Figure 5:
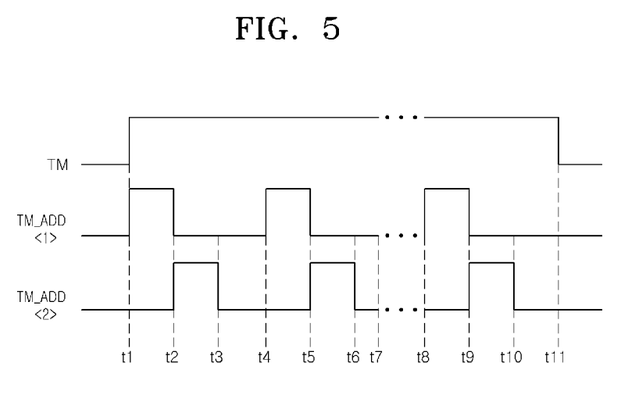
FIG. 5 is a timing diagram showing a test mode signal and test addresses in accordance with an embodiment of the present invention.

Operations of the programming circuit using an antifuse in accordance with an embodiment of the present invention will be described with reference to FIG. 5, by showing an operation of an embodiment when fails occur in the first and second cell blocks.

First, if a fail occurs in the first cell block, the first buffer IV10 inverts and buffers the first test address TM_ADD<1> including the periodic pulse during periods t1 to t11 during which the test mode signal TM is enabled to a logic high level and outputs the first pull-up signal PU<1>, and the first pull-up element P10 pull-up drives the first node nd10 to the level of the high voltage HV in response to the first pull-up signal PU<1>. The first antifuse ATFUSE10 is realized as a MOS transistor type capacitor such that the dielectric layer is ruptured by the level difference between the high voltage HV of the first node nd10 and the low voltage LV and connects the first node nd10 to the low voltage LV. The first transfer gate T10 is turned off in response to the test mode signal TM of the logic high level and does not transfer the signal of the first node nd10 as the first fuse signal FUSE<1>, and is turned on when the test mode signal TM is disabled to a logic low level after the period t11 at which point the dielectric layer of the first antifuse ATFUSE10 is completely ruptured and transfers the signal of the first node nd10 with a logic low level as the first fuse signal FUSE<1>. That is to say, the first node nd10 is pull-up driven to the level of the high voltage HV during the periods t1 to t2, t4 to t5 and t8 to t9 in which the first test address TM_ADD<1> has a logic high level, and at this time, the dielectric layer of the first antifuse ATFUSE10 is completely ruptured and the first fuse signal FUSE<1> is generated as a logic low level.

The NOR gate NR20 of the first programming signal generating section 200 inverts and buffers the first fuse signal FUSE<1> in response to the power-up signal PWRUP of the logic low level and generates the first programming signal PRG<1> to a logic high level, and the first latch stage 2000 does not latch the first programming signal PRG<1> in response to the first programming signal PRG<1> of the logic high level.

If a fail occurs in the second cell block, the second buffer IV11 inverts and buffers the second test address TM_ADD<2> including the periodic pulse during periods t1 to t11 during which the test mode signal TM is enabled to the logic high level and outputs the second pull-up signal PU<2>, and the second pull-up element P11 pull-up drives the second node nd11 to the level of the high voltage HV in response to the second pull-up signal PU<2>. The second antifuse ATFUSE11 is realized as a MOS transistor type capacitor such that the dielectric layer is ruptured by the level difference between the high voltage HV of the second node nd11 and the low voltage LV and connects the second node nd11 to the low voltage LV. The second transfer gate T11 is turned off in response to the test mode signal TM of the logic high level and does not transfer the signal of the second node nd11 as the second fuse signal FUSE<2>, and is turned on when the test mode signal TM is disabled to the logic low level after the period t11 at which point the dielectric layer of the second antifuse ATFUSE11 is completely ruptured and transfers the signal of the second node nd11 with a logic low level as the second fuse signal FUSE<2>. That is to say, the second node nd11 is pull-up driven to the level of the high voltage HV during the periods t2 to t3, t5 to t6 and t9 to t10 in which the second test address TM_ADD<2> has a logic high level, and at this time, the dielectric layer of the second antifuse ATFUSE11 is completely ruptured and the second fuse signal FUSE<2> is generated as a logic low level.

The NOR gate NR21 of the second programming signal generating section 201 inverts and buffers the second fuse signal FUSE<2> in response to the power-up signal PWRUP of the logic low level and generates the second programming signal PRG<2> to a logic high level, and the second latch stage 2001 does not latch the second programming signal PRG<2> in response to the second programming signal PRG<2> of the logic high level.

In the programming circuit using an antifuse configured as mentioned above, the dielectric layer of an antifuse is completely ruptured for a period in which a test mode signal is enabled, according to a test address which is generated as a signal including a periodic pulse when a fail occurs in a cell block, whereby it is possible to generate a stable programming signal.

Figure 4:
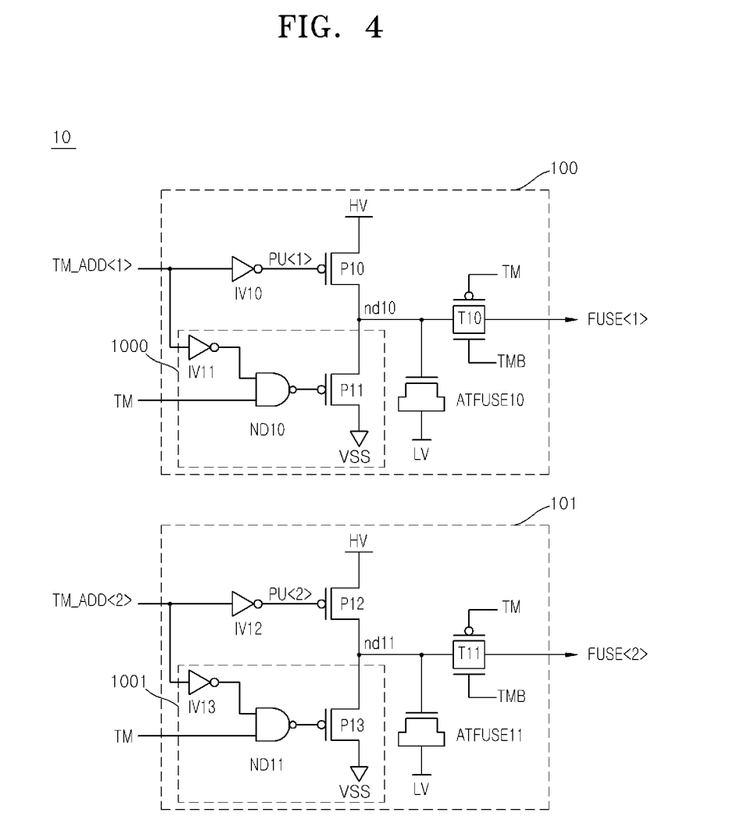
FIG. 4 is a circuit diagram of a fuse signal generation unit in accordance with another embodiment of the present invention.

FIG. 4 is a circuit diagram of a fuse signal generation unit in accordance with another embodiment of the present invention.

Referring to FIG. 4, a fuse signal generation unit 10 includes first and second fuse signal generating sections 100 and 101.

The first fuse signal generating section 100 includes a first buffer IV10 configured to invert and buffer a first test address TM_ADD<1> generated as a signal including a periodic pulse and output a first pull-up signal PU<1> when a fail occurs in a first cell block (not shown) during a period in which a test mode signal TM is enabled. The first fuse signal generating section 100 also includes a first pull-up element P10 placed between a high voltage HV and a first node nd10 and configured to pull-up drive the first node nd10 to the high voltage HV in response to the first pull-up signal PU<1>. The first fuse signal generating section 100 further includes a first antifuse ATFUSE10 placed between the first node nd10 and a low voltage LV and configured to be ruptured in the dielectric layer thereof depending upon the level of the first node nd10 and connect the first node nd10 to the low voltage LV. The first fuse signal generating section 100 may also comprise a first transfer gate T10 configured to transfer the signal of the first node nd10 as a first fuse signal FUSE<1> in response to the test mode signal TM. The first fuse signal generating section 100 may further comprise a first stabilization stage 1000 configured to connect the first node nd10 to a ground voltage VSS in response to the test mode signal TM when the first node nd10 is not pull-up driven to the level of the high voltage HV.

In detail, the first stabilization stage 1000 includes a second buffer IV11 configured to invert, buffer and output the first test address TM_ADD<1>, a first logic element ND10 configured to NAND the output of the second buffer IV11 and the test mode signal TM and output a resultant signal, and a first pull-down element P11 configured to connect the first node nd10 to the ground voltage VSS in response to the output signal of the first logic element ND10 when the first node nd10 is not pull-up driven to the high voltage HV.

The second fuse signal generating section 101 includes a third buffer IV12 configured to invert and buffer a second test address TM_ADD<2> generated as a signal including a periodic pulse and output a second pull-up signal PU<2> when a fail occurs in a second cell block (not shown) during the period in which the test mode signal TM is enabled. The second fuse signal generating section 101 also includes a second pull-up element P12 placed between the high voltage HV and a second node nd11 and configured to pull-up drive the second node nd11 to the level of the high voltage HV in response to the second pull-up signal PU<2>. The second fuse signal generating section 101 may also comprise a second antifuse ATFUSE11 placed between the second node nd11 and the low voltage LV and configured to be ruptured in the dielectric layer thereof depending upon the level of the second node nd11 and connect the second node nd11 to the low voltage LV. The second fuse signal generating section 101 further comprises a second transfer gate T11 configured to transfer the signal of the second node nd11 as a second fuse signal FUSE<2> in response to the test mode signal TM. Still further, the second fuse signal generating section 101 may comprise a second stabilization stage 1001 configured to connect the second node nd11 to the ground voltage VSS in response to the test mode signal TM when the second node nd11 is not pull-up driven to the high voltage HV.

In detail, the second stabilization stage 1001 includes a fourth buffer IV13 configured to invert, buffer and output the second test address TM_ADD<2>, a second logic element ND11 configured to NAND the output of the fourth buffer IV13 and the test mode signal TM and output a resultant signal, and a second pull-down element P13 configured to connect the second node nd11 to the ground voltage VSS in response to the output signal of the second logic element ND11 when the second node nd11 is not pull-up driven to the high voltage HV.

The test mode signal TM may be disabled to a logic low level when the dielectric layers of the first antifuse ATFUSE10 and the second antifuse ATFUSE11 are completely ruptured. Also, the first test address TM_ADD<1> is generated as a logic low level when a fail does not occur in the first cell block, and the second test address TM_ADD<2> is generated as a logic low level when a fail does not occur in the second cell block.

Operations of the programming circuit using an antifuse in accordance with another embodiment of the present invention will be described with reference to FIG. 5, by exemplifying that fails occur in the first and second cell blocks.

First, if a fail occurs in the first cell block, the first buffer IV10 inverts and buffers the first test address TM_ADD<1> including the periodic pulse during periods t1 to t11 during which the test mode signal TM is enabled to a logic high level and outputs the first pull-up signal PU<1>, and the first pull-up element P10 pull-up drives the first node nd10 to the level of the high voltage HV in response to the first pull-up signal PU<1>. The first antifuse ATFUSE10 is realized as a MOS transistor type capacitor such that the dielectric layer is ruptured by the level difference between the high voltage HV of the first node nd10 and the low voltage LV and connects the first node nd10 to the low voltage LV. In the first stabilization stage 1000, the second buffer IV11 inverts, buffers and outputs the first test address TM_ADD<1>, the first logic element ND10 NANDs the output of the second buffer IV11 and the test mode signal TM of the logic high level and outputs the resultant signal, and the first pull-down element P11 connects the first node nd10 to the ground voltage VSS in response to the output signal of the first logic element ND10 when the first node nd10 is not pull-up driven to the level of the high voltage HV. The first transfer gate T10 is turned off in response to the test mode signal TM of the logic high level and does not transfer the signal of the first node nd10 as the first fuse signal FUSE<1>, and is turned on when the test mode signal TM is disabled to a logic low level after the period t11 at which point the dielectric layer of the first antifuse ATFUSE10 is completely ruptured and transfers the signal of the first node nd10 with a logic low level as the first fuse signal FUSE<1>. That is to say, the first node nd10 is pull-up driven to the level of the high voltage HV during the periods t1 to t2, t4 to t5 and t8 to t9 in which the first test address TM_ADD<1> has a logic high level, and at this time, the dielectric layer of the first antifuse ATFUSE10 is completely ruptured and the first fuse signal FUSE<1> is generated as a logic low level. Further, the first node nd10 is connected to the ground voltage VSS during the periods t2 to t4, t5 to t7 and t9 to t11 in which the first node nd10 is not pull-up driven to the level of the high voltage HV.

The NOR gate NR20 of the first programming signal generating section 200 inverts and buffers the first fuse signal FUSE<1> in response to the power-up signal PWRUP of the logic low level and generates the first programming signal PRG<1> to a logic high level, and the first latch stage 2000 does not latch the first programming signal PRG<1> in response to the first programming signal PRG<1> of the logic high level.

Next, if a fail occurs in the second cell block, the third buffer IV12 inverts and buffers the second test address TM_ADD<2> including the periodic pulse during periods t1 to t11 during which the test mode signal TM is enabled to the logic high level and outputs the second pull-up signal PU<2>, and the second pull-up element P12 pull-up drives the second node nd11 to the level of the high voltage HV in response to the second pull-up signal PU<2>. The second antifuse ATFUSE11 is realized as a MOS transistor type capacitor such that the dielectric layer is ruptured by the level difference between the high voltage HV of the second node nd11 and the low voltage LV, and connects the second node nd11 to the low voltage LV. In the second stabilization stage 1001, the fourth buffer IV13 inverts, buffers and outputs the second test address TM_ADD<2>, the second logic element ND11 NANDs the output of the fourth buffer IV13 and the test mode signal TM of the logic high level and outputs the resultant signal, and the second pull-down element P12 connects the second node nd11 to the ground voltage VSS in response to the output signal of the second logic element ND11 when the second node nd11 is not pull-up driven to the level of the high voltage HV. The second transfer gate T11 is turned off in response to the test mode signal TM of the logic high level and does not transfer the signal of the second node nd11 as the second fuse signal FUSE<2>, and the second transfer gate T11 is turned on when the test mode signal TM is disabled to the logic low level after the period t11 at which point the dielectric layer of the second antifuse ATFUSE11 is completely ruptured and transfers the signal of the second node nd11 with a logic low level as the second fuse signal FUSE<2>. That is to say, the second node nd11 is pull-up driven to the level of the high voltage HV during the periods t2 to t3, t5 to t6 and t9 to t10 in which the second test address TM_ADD<2> has a logic high level, and at this time, the dielectric layer of the second antifuse ATFUSE11 is completely ruptured and the second fuse signal FUSE<2> is generated as a logic low level. Further, the second node nd11 is connected to the ground voltage VSS during the periods t1 to t2, t3 to t5, t6 to t7, t8 to t9 and t10 to t11 in which the second node nd11 is not pull-up driven to the level of the high voltage HV.

The NOR gate NR21 of the second programming signal generating section 201 inverts and buffers the second fuse signal FUSE<2> in response to the power-up signal PWRUP of the logic low level and generates the second programming signal PRG<2> to a logic high level, and the second latch stage 2001 does not latch the second programming signal PRG<2> in response to the second programming signal PRG<2> of the logic high level.

As is apparent from the above descriptions, the programming circuit using an antifuse according to an embodiment of the present invention, configured as mentioned above, provides advantages in that, when a node is driven by a high voltage, the node is connected to a ground voltage so that influence by surrounding environment is reduced, whereby it is possible to generate a stable programming signal.

Embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:
1. A programming circuit using an antifuse, comprising:
   a fuse signal generation unit including an antifuse which connects a node with a low voltage in response to a test address when the node is driven to a level of a high voltage, and configured to output a signal of the node as a fuse signal in response to a test mode signal; and
   a programming signal generation unit configured to buffer the fuse signal in response to a power-up signal and generate a programming signal.
2. The programming circuit according to claim 1, wherein the test address is generated as a signal including a periodic pulse when a fail occurs in a cell block corresponding to the test address, during a period in which the test mode signal is enabled.
3. The programming circuit according to claim 1, wherein the antifuse is a MOS transistor type capacitor of which dielectric layer is ruptured by a level difference between the high voltage and the low voltage as the high voltage is applied to the node.
4. The programming circuit according to claim 1, wherein the power-up signal is a signal which transitions to a logic low level when a level of a power supply voltage reaches a predetermined target level.
5. The programming circuit according to claim 1, wherein the fuse signal generation unit comprises:
   a first fuse signal generating section configured to connect a first node to the low voltage in response to a first test address when the first node is driven to the high voltage, and generate a first fuse signal; and
   a second fuse signal generating section configured to connect a second node to the low voltage in response to a second test address when the second node is driven to the high voltage, and generate a second fuse signal.
6. The programming circuit according to claim 5, wherein the first fuse signal generating section comprises:
   a first buffer configured to invert and buffer the first test address and output a first pull-up signal;
   a first pull-up element placed between the high voltage and the first node and configured to pull-up drive the first node to the level of the high voltage in response to the first pull-up signal;
   a first antifuse placed between the first node and the low voltage and configured to connect the first node to the low voltage in response to a level of the first node; and
   a first transfer gate configured to transfer a signal of the first node as the first fuse signal in response to the test mode signal.
7. The programming circuit according to claim 5, wherein the second fuse signal generating section comprises:
   a second buffer configured to invert and buffer the second test address and output a second pull-up signal;
   a second pull-up element placed between the high voltage and the second node and configured to pull-up drive the second node to the level of the high voltage in response to the second pull-up signal;
   a second antifuse placed between the second node and the low voltage and configured to connect the second node to the low voltage in response to a level of the second node; and
   a second transfer gate configured to transfer a signal of the second node as the second fuse signal in response to the test mode signal.
8. The programming circuit according to claim 5, wherein the programming signal generation unit comprises:
   a first programming signal generating section configured to buffer the first fuse signal in response to the power-up signal and output a first programming signal as the programming signal; and
   a second programming signal generating section configured to buffer the second fuse signal in response to the power-up signal and output a second programming signal as the programming signal.

9. The programming circuit according to claim 8, wherein the first programming signal generating section includes a first latch unit configured to latch the first programming signal when the first fuse signal is not generated to a level of the low voltage.

10. The programming circuit according to claim 8, wherein the second programming signal generating section includes a second latch unit configured to latch the second programming signal when the second fuse signal is not generated to the level of the low voltage.

11. A programming circuit using an antifuse, comprising:
a fuse signal generation unit including an antifuse which connects a node with a low voltage in response to a test address when the node is driven to a level of a high voltage, and configured to connect the node with a ground voltage in response to a test mode signal when the node is not driven to the level of the high voltage and output a signal of the node as a fuse signal, where the fuse signal is buffered in response to a power-up signal and is associated with a programming signal.

12. The programming circuit according to claim 11, wherein the test address is generated as a signal including a periodic pulse when a fail occurs in a cell block corresponding to the test address, during a period in which the test mode signal is enabled.

13. The programming circuit according to claim 11, wherein the antifuse is a MOS transistor type capacitor of which dielectric layer is ruptured by a level difference between the high voltage and the low voltage as the high voltage is applied to the node.

14. The programming circuit according to claim 11, wherein the power-up signal is a signal which transitions to a logic low level when a level of a power supply voltage reaches a predetermined target level.

15. The programming circuit according to claim 11, wherein the fuse signal generation unit comprises:
a first fuse signal generating section configured to connect a first node to the low voltage in response to a first test address when the first node is driven to the high voltage, and generate a first fuse signal; and
a second fuse signal generating section configured to connect a second node to the low voltage in response to a second test address when the second node is driven to the high voltage, and generate a second fuse signal.

16. The programming circuit according to claim 15, wherein the first fuse signal generating section comprises:
a first buffer configured to invert and buffer the first test address and output a first pull-up signal;
a first pull-up element placed between the high voltage and the first node and configured to pull-up drive the first node to the level of the high voltage in response to the first pull-up signal;
a first antifuse placed between the first node and the low voltage and configured to connect the first node to the low voltage in response to a level of the first node; and
a first transfer gate configured to transfer a signal of the first node as the first fuse signal in response to the test mode signal.

17. The programming circuit according to claim 16, wherein the first fuse signal generating section further comprises:
a first stabilization stage configured to connect the first node to the ground voltage in response to the test mode signal when the first node is not pull-up driven to the level of the high voltage.

18. The programming circuit according to claim 17, wherein the first stabilization stage comprises:
a second buffer configured to invert, buffer and output the first test address;
a first logic element configured to perform a NANDing operation for an output signal of the second buffer and the test mode signal and output a resultant signal; and
a first pull-down element configured to connect the first node to the ground voltage in response to an output signal of the first logic element.

19. The programming circuit according to claim 15, wherein the second fuse signal generating section comprises:
a third buffer configured to invert and buffer the second test address and output a second pull-up signal;
a second pull-up element placed between the high voltage and the second node and configured to pull-up drive the second node to the level of the high voltage in response to the second pull-up signal;
a second antifuse placed between the second node and the low voltage and configured to connect the second node to the low voltage in response to a level of the second node; and
a second transfer gate configured to transfer a signal of the second node as the second fuse signal in response to the test mode signal.

20. The programming circuit according to claim 19, wherein the second fuse signal generating section further comprises:
a second stabilization stage configured to connect the second node to the ground voltage in response to the test mode signal when the second node is not pull-up driven to the level of the high voltage.

21. The programming circuit according to claim 20, wherein the second stabilization stage comprises:
a fourth buffer configured to invert, buffer and output the second test address;
a second logic element configured to perform a NANDing operation for an output signal of the fourth buffer and the test mode signal and output a resultant signal; and
a second pull-down element configured to connect the second node to the ground voltage in response to an output signal of the second logic element.

22. The programming circuit according to claim 15, further comprising a programming signal generation unit configured to buffer the fuse signal in response to a power-up signal and generate the programming signal, wherein the programming signal generation unit comprises:
a first programming signal generating section configured to buffer the first fuse signal in response to the power-up signal and output a first programming signal as the programming signal; and
a second programming signal generating section configured to buffer the second fuse signal in response to the power-up signal and output a second programming signal as the programming signal.

23. The programming circuit according to claim 22, wherein the first programming signal generating section includes a first latch unit configured to latch the first programming signal when the first fuse signal is not generated to a level of the low voltage.

24. The programming circuit according to claim 22, wherein the second programming signal generating section includes a second latch unit configured to latch the second programming signal when the second fuse signal is not generated to the level of the low voltage.

* * * * *